United States Patent
Kurihara et al.

(10) Patent No.: US 7,643,371 B2
(45) Date of Patent: Jan. 5, 2010

(54) ADDRESS/DATA MULTIPLEXED DEVICE

(75) Inventors: Kazuhiro Kurihara, Kanagawa (JP);
Nobutaka Taniguchi, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 219 days.

(21) Appl. No.: 11/986,385

(22) Filed: Nov. 20, 2007

(65) Prior Publication Data
US 2008/0159011 A1 Jul. 3, 2008

(30) Foreign Application Priority Data
Dec. 28, 2006 (JP) ............................. 2006-355023

(51) Int. Cl.
*G11C 8/00* (2006.01)
(52) U.S. Cl. ..................... 365/230.02; 365/230.08; 365/189.03
(58) Field of Classification Search ............ 365/230.02, 365/230.08, 189.03
See application file for complete search history.

(56) References Cited

U.S. PATENT DOCUMENTS

| | | | |
|---|---|---|---|
| 4,656,610 A * | 4/1987 | Yoshida et al. ......... | 365/189.07 |
| 4,758,995 A * | 7/1988 | Sato ....................... | 365/189.05 |
| 5,083,296 A * | 1/1992 | Hara et al. .............. | 365/230.02 |
| 5,249,160 A | 9/1993 | Wu et al. | |
| 5,537,353 A | 7/1996 | Rao et al. | |
| 6,484,231 B1 * | 11/2002 | Kim .......................... | 711/105 |
| 7,035,154 B2 * | 4/2006 | Takahashi et al. ........... | 365/201 |
| 2005/0141254 A1 | 6/2005 | Hong et al. | |
| 2006/0092754 A1 | 5/2006 | Jeong | |

* cited by examiner

Primary Examiner—Tuan T. Nguyen

(57) ABSTRACT

A semiconductor device and a method of controlling the semiconductor device, the semiconductor device including: a memory cell array; a terminal that inputs or outputs storage data stored in the memory cell array, and inputs address data indicating an address in the memory cell array at which the storage data is input or output, the terminal including: a first terminal that inputs a first part of the address data; and a second terminal that inputs a second part of the address data, wherein the second part of the address data is included of the entire remaining portion of the address data not including the first part of the address data; a first internal address line and a second internal address line to which the address data is supplied; and a switch that couples the first part of the address data to one of the first internal address line or the second internal address line in accordance with predetermined switch information, while coupling the second part of the address data to the other one of the first internal address line or the second internal address line, when the address data is input to the terminal.

20 Claims, 15 Drawing Sheets

FIG. 7

| PAD OF CHIP1 | D0/D16 /A0/A16 | D1/D17 /A1/A17 | ... | D8/D24 /A8/A24 | ... | D15/D31 /A15 | A0/A16 | ... | A8/A24 | ... | A15 |
|---|---|---|---|---|---|---|---|---|---|---|---|
| EXTERNAL TERMINAL | ExD0/A0 | ExD1/A1 | ... | Ex D8/A8 | ... | Ex D15/A15 | Ex D16/A16 | ... | Ex D24/A24 | ... | ExD31 |
| EXTERNAL INPUT/OUTPUT | AB0 | AB1 | ... | AB | ... | AB15 | AB16 | ... | AB24 | ... | — |
| I/O CIRCUIT INPUT | — | — | ... | — | ... | — | — | ... | — | ... | — |
| INTERNAL ADDRESS LINE | AI (0) | AI (1) | ... | AI (8) | ... | AI (15) | AI (16) | ... | AI (24) | ... | — |

FIG. 8

| PAD OF CHIP1 | D0/D16 /A0/A16 | D1/D17 /A1/A17 | ... | D8/D24 /A8/A24 | ... | D15/D31 /A15 | A0/A16 | ... | A8/A24 | ... | A15 |
|---|---|---|---|---|---|---|---|---|---|---|---|
| EXTERNAL TERMINAL | ExD0/A0 | ExD1/A1 | ... | Ex D8/A8 | ... | Ex D15/A15 | Ex D16/A16 | ... | Ex D24/A24 | ... | ExD31 |
| EXTERNAL INPUT/OUTPUT | DB0 | DB1 | ... | DB8 | ... | DB15 | DB16 | ... | DB24 | ... | DB31 |
| I/O CIRCUIT INPUT | DB0 | DB1 | ... | DB8 | ... | DB15 | — | ... | — | ... | — |
| INTERNAL ADDRESS LINE | — | — | ... | — | ... | — | — | ... | — | ... | — |

FIG. 9

| PAD OF CHIP2 | D0/D16 /A0/A16 | D1/D17 /A1/A17 | ... | D8/D24 /A8/A24 | ... | D15/D31 /A15 | A0/A16 | ... | A8/A24 | ... | A15 |
|---|---|---|---|---|---|---|---|---|---|---|---|
| EXTERNAL TERMINAL | Ex D16/A16 | Ex D17/A17 | ... | Ex D24/A24 | ... | ExD31 | Ex D0/A0 | ... | Ex D8/A8 | ... | Ex D15/A15 |
| EXTERNAL INPUT/OUTPUT | AB16 | AB17 | ... | AB24 | ... | — | AB0 | ... | AB8 | ... | AB15 |
| I/O CIRCUIT INPUT | — | — | ... | — | ... | — | — | ... | — | ... | — |
| INTERNAL ADDRESS LINE | AI (16) | AI (17) | ... | AI (24) | ... | — | AI (0) | ... | AI (8) | ... | AI (15) |

FIG. 10

| PAD OF CHIP2 | D0/D16 /A0/A16 | D1/D17 /A1/A17 | ... | D8/D24 /A8/A24 | ... | D15/D31 /A15 | A0/A16 | ... | A8/A24 | ... | A15 |
|---|---|---|---|---|---|---|---|---|---|---|---|
| EXTERNAL TERMINAL | Ex D16/A16 | Ex D17/A17 | ... | Ex D24/A24 | ... | ExD31 | Ex D0/A0 | ... | Ex D8/A8 | ... | Ex D15/A15 |
| EXTERNAL INPUT/OUTPUT | DB16 | DB17 | ... | DB24 | ... | DB31 | DB0 | ... | DB8 | ... | DB15 |
| I/O CIRCUIT INPUT | DB16 | DB17 | ... | DB24 | ... | DB31 | — | ... | — | ... | — |
| INTERNAL ADDRESS LINE | — | — | ... | — | ... | — | — | ... | — | ... | — |

# ADDRESS/DATA MULTIPLEXED DEVICE

CLAIM OF PRIORITY

This is a continuation-in-part of International Application No. JP 2006/355023, filed Dec. 28, 2006 which was not published in English under PCT Article 21(2).

TECHNICAL FIELD

This invention relates generally to semiconductor devices and methods of controlling the semiconductor devices, and more particularly, to a semiconductor device having semiconductor memory devices and a method of controlling the semiconductor device.

BACKGROUND OF THE INVENTION

Recently, semiconductor devices such as flash memories, DRAMs, and SRAMs have become widely used in many electronic devices. A semiconductor memory device includes a memory cell array having memory cells in a matrix fashion, with data being stored in the memory cells. An external circuit designates an address at which storage data stored in the memory cell array is to be input or output, and then inputs or outputs the data to or from the memory cell array. The input/output of the storage data to/from the external circuit and an input of address data indicating the address are performed via an input/output circuit. The input/output between the external circuit and the input/output circuit is performed in a parallel manner with respect to bits. The number of bits is called the data width, which is 16 bits or 32 bits, for example. The address in the memory cell array at which the storage data is input or output is defined by 25-bit address data, for example. The input/output of the storage data and address data between the external circuit and the input/output circuit is performed via data terminals and address terminals. However, to minimize the number of required terminals, some data terminals also serve as address terminals.

A semiconductor memory device having data terminals also serving as address terminals is now described, with a flash memory being taken as an example of a semiconductor memory device. FIG. 1 is a schematic view of a flash memory that inputs or outputs storage data having a data width of 16 bits, and involves 25-bit address data. A memory cell array 68 and an input/output circuit 69 are provided on a semiconductor chip 60. The input/output circuit 69 is coupled to pads 62 and 63. The pads 62 and 63 are coupled to external terminals 66 and 67 on the package with wires. The pads 62 are pads D0/A0 through D15/A15 that are coupled to external terminals ExD0/A0 through ExD15/A15, which are the external terminals 66. The pads 63 are pads A16 through A24 that are coupled to external terminals ExA16 through ExA24, which are the external terminals 67.

FIG. 2 shows a data structure of data to be input or output between an external circuit and the external terminals 66 and 67. The external circuit includes a system bus also serving as the bus for transmitting address data and storage data. The external terminal ExD0/A0 inputs or outputs the first bit DB0 of the storage data at the time of data input/output. The external terminal ExD0/A0 also inputs the first bit AB0 of the address data at the time of address input. Each of the external terminals ExD0/A0 through ExD15/A15 performs the same as above. In this manner, the external terminals ExD0/A0 through ExD15/A15 serve as data terminals and address terminals. Meanwhile, the external terminals ExA16 through ExA24 are address terminals that only input address data. The pads 62 provided on the semiconductor chip 60 serve as data pads and address pads. Meanwhile, the pads 63 are address pads that input only addresses.

Japanese Unexamined Patent Publication No. 9-231131 discloses a structure in which semiconductor memory devices having address terminals that do not serve as data terminals. The address terminals of each of the semiconductor memory devices are coupled together and the data terminals are coupled to external buses independently of one another. Accordingly, even if the data width of each of the semiconductor memory devices is small, it is possible to cope with external buses with large widths. As such, there is a demand for an increase in data width for inputting and outputting storage data in semiconductor memory devices. However, the production of a semiconductor memory device having a 32-bit data width will require the design and development of new input/output circuits. In such a case, the development period may be long and costly. To counter this problem, two semiconductor chips each having a data width of 16 bits are used to form a semiconductor memory device having a 32-bit data width, as in a first conventional example. With such a semiconductor memory device having a 32-bit data width, the development period can be shortened, and the development cost can be lowered. However, when a semiconductor memory device having a 32-bit data width is formed in a conventional manner using two semiconductor chips that have address terminals serving as data terminals and have a 16-bit data width, the loads on the external terminals become uneven.

SUMMARY OF THE INVENTION

The present invention has been made in view of the above circumstances and provides a semiconductor device and a method of controlling the semiconductor device, by which the loads on the external terminals can be made uniform, and a semiconductor memory device having a large data width can be formed with semiconductor devices having small data widths for storage data.

According to an aspect of the present invention, there is provided a semiconductor device including: a memory cell array; a terminal that inputs or outputs storage data stored in the memory cell array, and inputs address data indicating an address in the memory cell array at which the storage data is input or output, the terminal including a first terminal that inputs part of the address data and a second terminal that inputs the rest of the address data; a first internal address line and a second internal address line to which the address data is supplied; and a switch that couples the part of the address data to either the first internal address line or the second internal address line in accordance with predetermined switch information, while coupling the rest of the address data to the other of the first or second internal address line, when the address data is input to the terminal. According to this aspect, the switch can set address data by switching or not switching part of the address data to and from the rest of the address data. With the use of two semiconductor devices of this invention, the loads coupled to external terminals can be made uniform. In this manner, a semiconductor memory device having a larger data width for storage data can be provided.

The semiconductor device may be configured so that the storage data is input to or output from the memory cell array, without passing through the switch, when the storage data is input to or output from the terminal. With this structure, the storage data can be input to or output from the memory cell array, regardless of the switch information.

The semiconductor device may be configured so that the first terminal inputs or outputs the storage data, and inputs the part of the address data; and that the second terminal inputs the rest of the address data.

The semiconductor device may further include a switch information terminal that inputs the predetermined switch information, wherein the predetermined switch information is a voltage applied to the switch information terminal. The semiconductor device may further include a switch information storage unit that stores the predetermined switch information. With these structures, the switch information can be readily input.

According to another aspect of the present invention, there is provided a semiconductor device including: a first semiconductor device that is the above-mentioned semiconductor device; and a second semiconductor device that is the above-mentioned semiconductor device, wherein the first terminal of the first semiconductor device is coupled to a first external terminal that inputs or outputs first storage data that is part of the storage data stored in the memory cell arrays of the first semiconductor device and the second semiconductor device, and inputs first address data that is the part of the address data indicating an address in each of the memory cell arrays at which the storage data is input or output; wherein the second terminal of the first semiconductor device is coupled to a second external terminal that inputs or outputs second storage data that is the rest of the storage data, and inputs second address data that is the rest of the address data; wherein the first terminal of the second semiconductor device is coupled to the second external terminal; and wherein the second terminal of the second semiconductor device is coupled to the first external terminal. According to this aspect, each one of the external terminals is coupled to two terminals. Accordingly, the loads coupled to the external terminals can be made uniform. Thus, it is possible to input or output storage data having a larger number of bits than the value of the data width for storage data in the first semiconductor device and the second semiconductor device.

The semiconductor device may be configured so that the predetermined switch information in the first semiconductor device is different from the predetermined switch information in the second semiconductor device.

The semiconductor device may be configured so that the first storage data has the same size as the second storage data. With this arrangement, storage data can be stored with the use of semiconductor devices having the same storage capacities and the same structures.

According to yet another aspect of the present invention, there is provided a method of controlling a semiconductor device that includes: a memory cell array; a terminal that inputs and outputs storage data stored in the memory cell array, and inputs address data indicating an address in the memory cell array at which the storage data is input or output, the terminal including a first terminal that inputs part of the address data and a second terminal that inputs the rest of the address data; and a first internal address line and a second internal address line to which the address data is supplied, the method comprising: coupling the part of the address data to either the first internal address line or the second internal address line, while coupling the rest of the address data to the other of the first internal address line or the second internal address line, based on predetermined switch information, when the address data is input to the terminal. According to this aspect, the switch can set address data by switching or not switching part of the address data to and from the rest of the address data. With the use of two semiconductor devices that are controlled in accordance this invention, the loads coupled to external terminals can be made uniform. Thus, storage data having a larger data width can be stored.

According to a further aspect of the present invention, there is provided a method of controlling a first semiconductor device and a second semiconductor device, each of the first semiconductor device and the second semiconductor device including: a memory cell array; a terminal that inputs and outputs storage data stored in the memory cell array, and inputs address data indicating an address in the memory cell array at which the storage data is input or output, the terminal including a first terminal that inputs part of the address data and a second terminal that inputs the rest of the address data; and a first internal address line and a second internal address line to which the address data is supplied, the method including: coupling the first terminal of the first semiconductor device to a first external terminal that inputs or outputs first storage data that is part of the storage data stored in the memory cell arrays of the first semiconductor device and the second semiconductor device, the first external terminal also inputting first address data that is the part of the address data indicating an address in the memory cell array at which the storage data is input or output; coupling the second terminal of the first semiconductor device to a second external terminal that inputs or outputs second storage data that is the rest of the storage data, and also inputs second address data that is the rest of the address data; coupling the first terminal of the second semiconductor device to the second external terminal; coupling the second terminal of the second semiconductor device to the first external terminal; and when the address data is input to the terminal of each of the first semiconductor device and the second semiconductor device, coupling the part of the address data to either the first internal address line or the second internal address line, while coupling the rest of the address data to the other of the first or second internal address line, based on predetermined switch information. According to this aspect, the loads coupled to external terminals can be made uniform. Accordingly, it is possible to input or output storage data having a larger number of bits than the value of the data width for storage data in the first semiconductor device and the second semiconductor device.

As described above, in accordance with the present invention, a semiconductor memory device having a larger data width can be formed from semiconductor devices having small data widths for storage data, with the loads on the external terminals being made uniform.

BRIEF DESCRIPTION OF THE DRAWINGS

FIG. 7 shows a data structure that is used where address data is input to the semiconductor chip 10a of the first embodiment;

FIG. 8 shows a data structure that is used where storage data is input to the semiconductor chip 10a of the first embodiment;

FIG. 9 shows a data structure that is used where address data is input to the semiconductor chip 10b of the first embodiment;

FIG. 10 shows a data structure that is used where storage data is input to the semiconductor chip 10b of the first embodiment;

DETAILED DESCRIPTION

Figure 1:
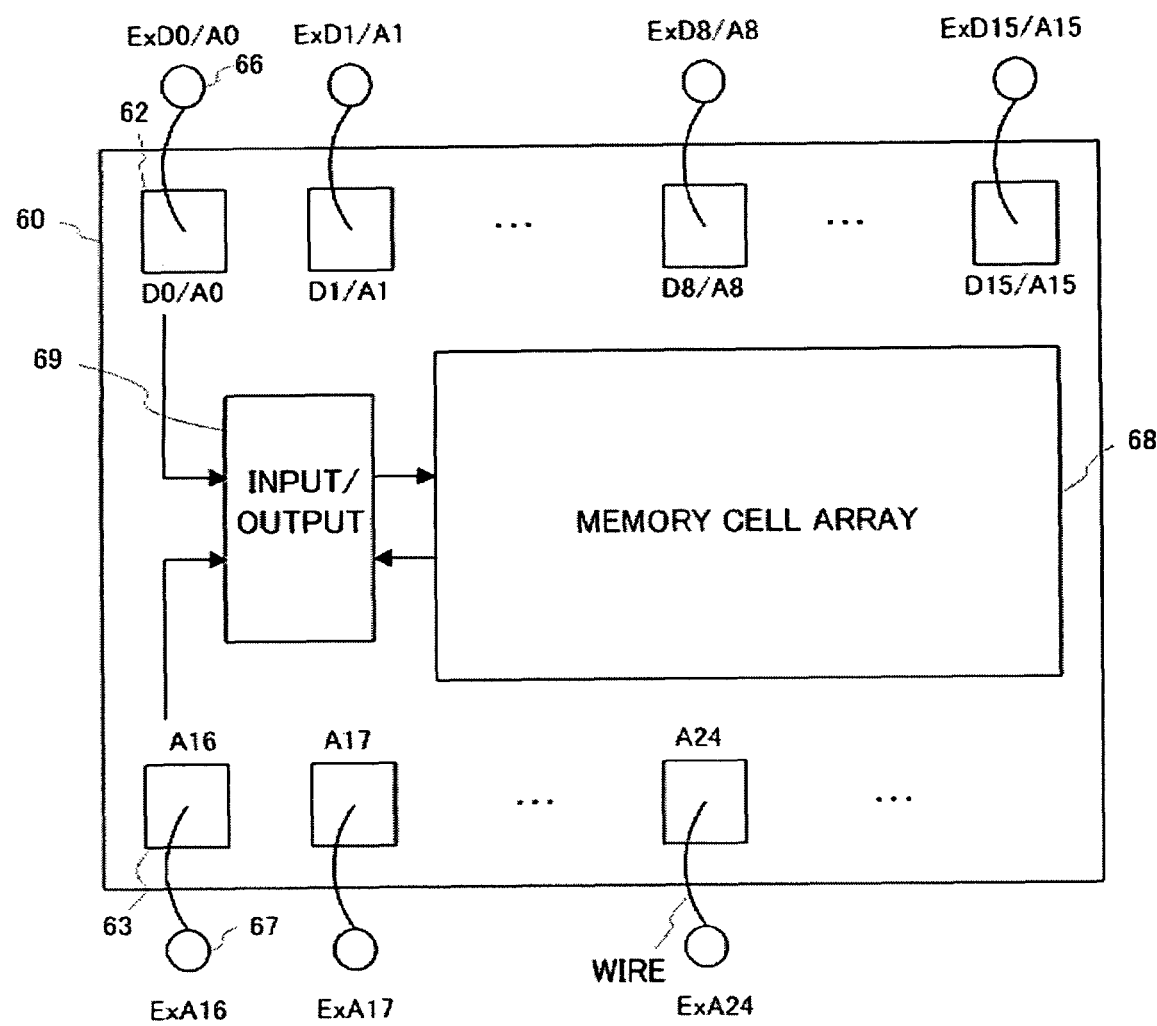
FIG. 1 is a schematic view of a conventional semiconductor memory device.
Figure 2:
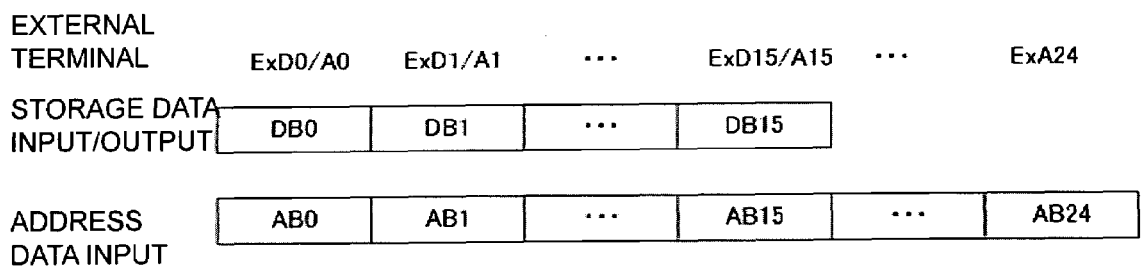
FIG. 2 shows a data structure of conventional external terminals.
Figure 3:
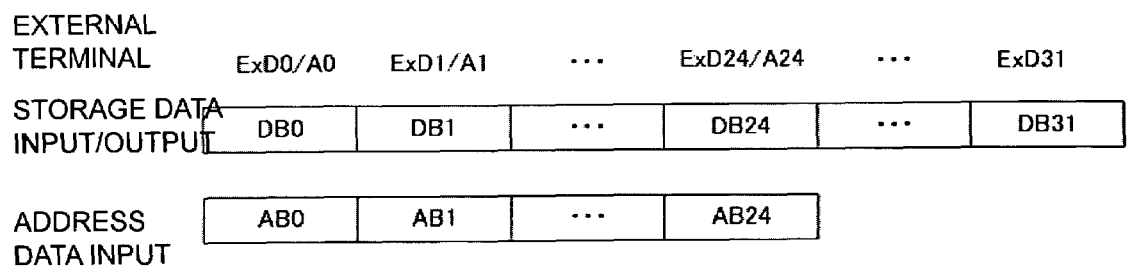
FIG. 3 shows data structures of external terminals of a comparative example and an embodiment of the present invention.

The following is a description of an example case where external terminals having a 32-bit data width for storage data and a 25-bit data width for address data serve as data terminals and address terminals. FIG. 3 shows the structure of data that is exchanged between external circuits and the external terminals in this case. External terminals ExD0/A0 through ExD24/A24 serve as both data terminals and address terminals. External terminals ExD25 through ExD31 are data terminals.

Figure 4:
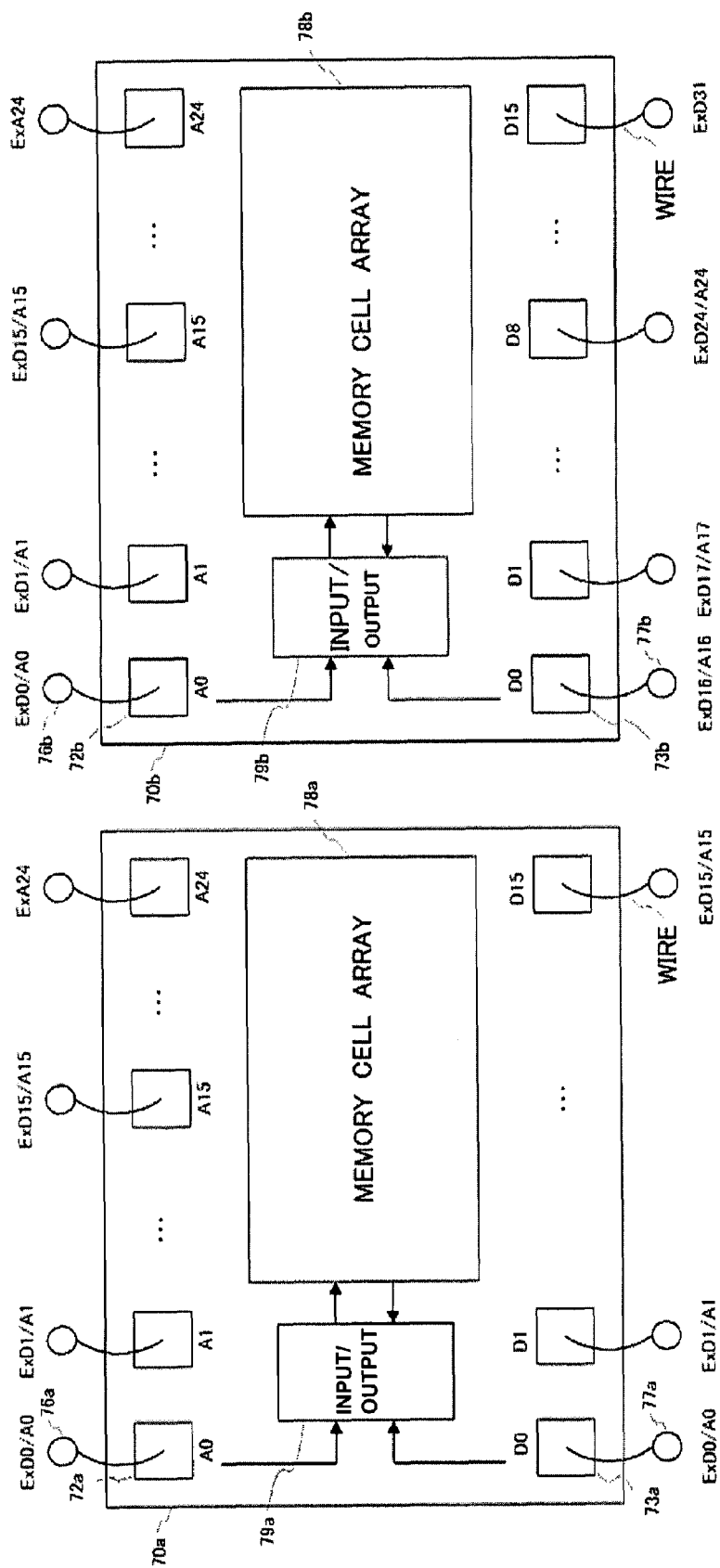
FIG. 4 is a schematic view of a semiconductor memory device of the comparative example.

FIG. 4 shows a semiconductor device as a comparative example that includes semiconductor chips 70a and 70b having a 16-bit data length for storage data and having data pads that do not serve as address pads. This semiconductor device inputs and outputs the storage data shown in FIG. 3 to and from external circuits. The semiconductor chips 70a and 70b include memory cell arrays 78a and 78b, and input/output circuits 79a and 79b, respectively. The semiconductor chips 70a and 70b also include address pads 72a and 72b, and data pads 73a and 73b, respectively. Pads A0 through A24 that are the address pads 72a of the semiconductor chip 70a are coupled to the terminals ExD0/A0 through ExA24 that are external terminals 76a, respectively. Accordingly, when address data is input from the external terminals 76a to the address pads A0 through A24, the bits AB0 through AB24 of the address data are input to the input/output circuit 79a. Meanwhile, pads D0 through D15 that are the data pads 73a are coupled to the terminals ExD0/A0 through ExD15/A15 that are external terminals 77a, respectively. Accordingly, when storage data is input from the external terminals 77a to the data pads D0 through D15, the bits DB0 through DB15 of the storage data are input to the input/output circuit 79a. In this manner, the bits DB0 through DB15, which are 16 bits of the 32 bits of the data width of the storage data in the external terminals, are stored in the semiconductor chip 70a.

Pads A0 through A24 that are the address pads 72b of the semiconductor chip 70b are coupled to the terminals ExD0/ A0 through ExA24 that are external terminals 76b, respectively. Accordingly, when address data is input from the external terminals 76b to the address pads A0 through A24, the bits AB0 through AB24 of the address data are input to the input/output circuit 79b. Meanwhile, pads D0 through D15 that are the data pads 73b are coupled to the terminals ExD16/A16 through ExD31 that are external terminals 77b, respectively. Accordingly, when storage data is input from the external terminals 77b to the data pads D0 through D15, the bits DB16 through DB31 of the storage data are input to the input/output circuit 79b. In this manner, the bits DB16 through DB31, which are the other 16 bits of the 32 bits of the data width of the storage data in the external terminals, are stored in the semiconductor chip 70b. As described above, in the comparative example, two semiconductor chips that have a 16-bit data width for storage data and include data input pads that do not serve as address pads are employed. With this arrangement, a semiconductor memory device that has a 32-bit data width for the storage data and a 25-bit data width for the address data, and includes data terminal also serving as address terminals is realized.

However, the semiconductor memory device of the comparative example has the following problem. As shown in FIG. 4, the external terminal ExD0/A0 is coupled to three pads: the pads A0 and D0 of the semiconductor chip 70a, and the pad A0 of the semiconductor chip 70b. The external terminal ExA31 is coupled to one pad: the pad D15 of the semiconductor chip 70a. In the comparative example, each external terminal is coupled to either one or three pads. As a result, the loads on the external terminals vary, which is a problem. The following is a description of embodiments that solve the above problem.

Figure 5:
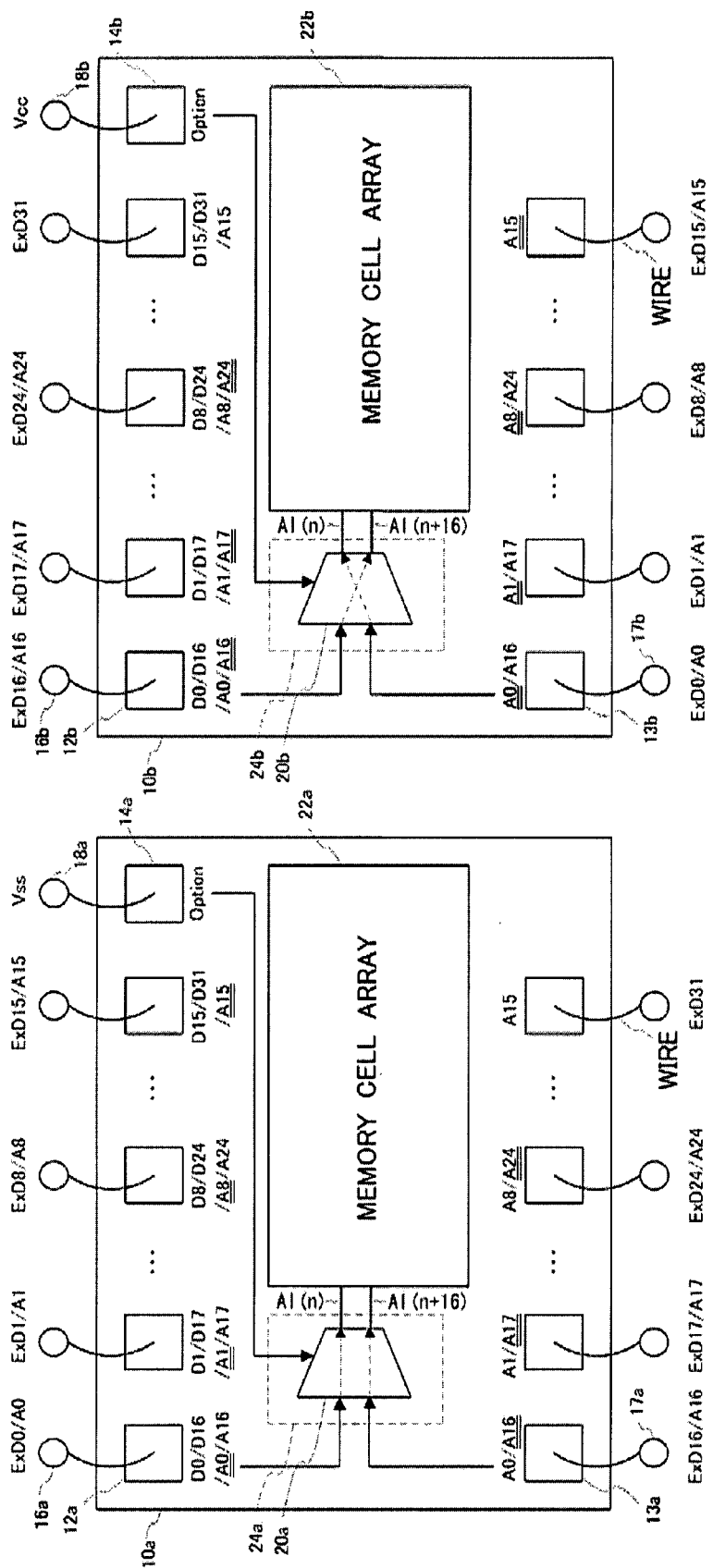
FIG. 5 is a schematic view of a semiconductor memory device in accordance with a first embodiment of the present invention.

FIG. 5 is a schematic view of a semiconductor memory device in accordance with a first embodiment of the present invention. Semiconductor chips 10a and 10b are semiconductor devices that have a 16-bit data width for storage data, and include data pads also serving as address pads. The semiconductor chips 10a and 10b include memory cell arrays 22a and 22b having flash memory cells, and input/output circuits 24a and 24b, respectively. The input/output circuits 24a and 24b include switches 20a and 20b that switch address data according to switch information input from option pads 14a and 14b, respectively.

The switches 20a and 20b are coupled to first internal address lines AI(n) and second internal address lines AI(n+ 16). Here, "n" is 0 to 15 for the first internal address lines, and is 0 to 8 for the second internal address lines. The semiconductor chips 10a and 10b include first pads 12a and 12b, second pads 13a and 13b, and the option pads 14a and 14b through which the switch information is input. When the switch information indicates Vcc, the input/output circuits 24a and 24b couple address data that is input to the first pads to the second internal address lines AI(n+16), and couple address data that is input to the second pads to the first internal address lines AI(n). The coupling operations are performed to switch address data. When the switch information indicates Vss, the input/output circuits 24a and 24b couple address data that is input to the first pads to the first internal address lines AI(n), and couple address data that is input to the second pads to the second internal address lines AI(n+16). The operations are performed to not switch address data. The double underlines attached to the reference numbers of the pads 12a, 13a, 12b, and 13b indicate the address data that is selected in the semiconductor chips 10a and 10b. For example, the double underline attached to "A0" of "D0/D16/A0/A16, which is one of the first pads 12a, indicates that the address data input through this pad is the bit AB0. This will be described later in greater detail.

The first pads 12a of the semiconductor chip 10a, which are denoted by "D0/D16/A0/A16" through "D15/D31/A15," are coupled to external terminals ExD0/A0 through ExD15/A15, respectively. The second pads 13a, which are denoted by "A0/A16" through "A15," are coupled to external terminals ExD16/A16 through ExD31, respectively. The option pad 14a is coupled to Vss, which is at the low level. Accordingly, the switch 20a does not switch address data. Meanwhile, the first pads 12b of the semiconductor chip 10b, which are denoted by "D0/D16/A0/A16" through "D15/D31/A15," are coupled to external terminals ExD16/A16 through ExD31, respectively. The second pads 13b, which are denoted by "A0/A16" through "A15," are coupled to external terminals ExD0/A0 through ExD15/A15, respectively. The option pad 14b is coupled to Vcc, which is at the high level. Accordingly, the switch 20b switches address data.

Figure 6:
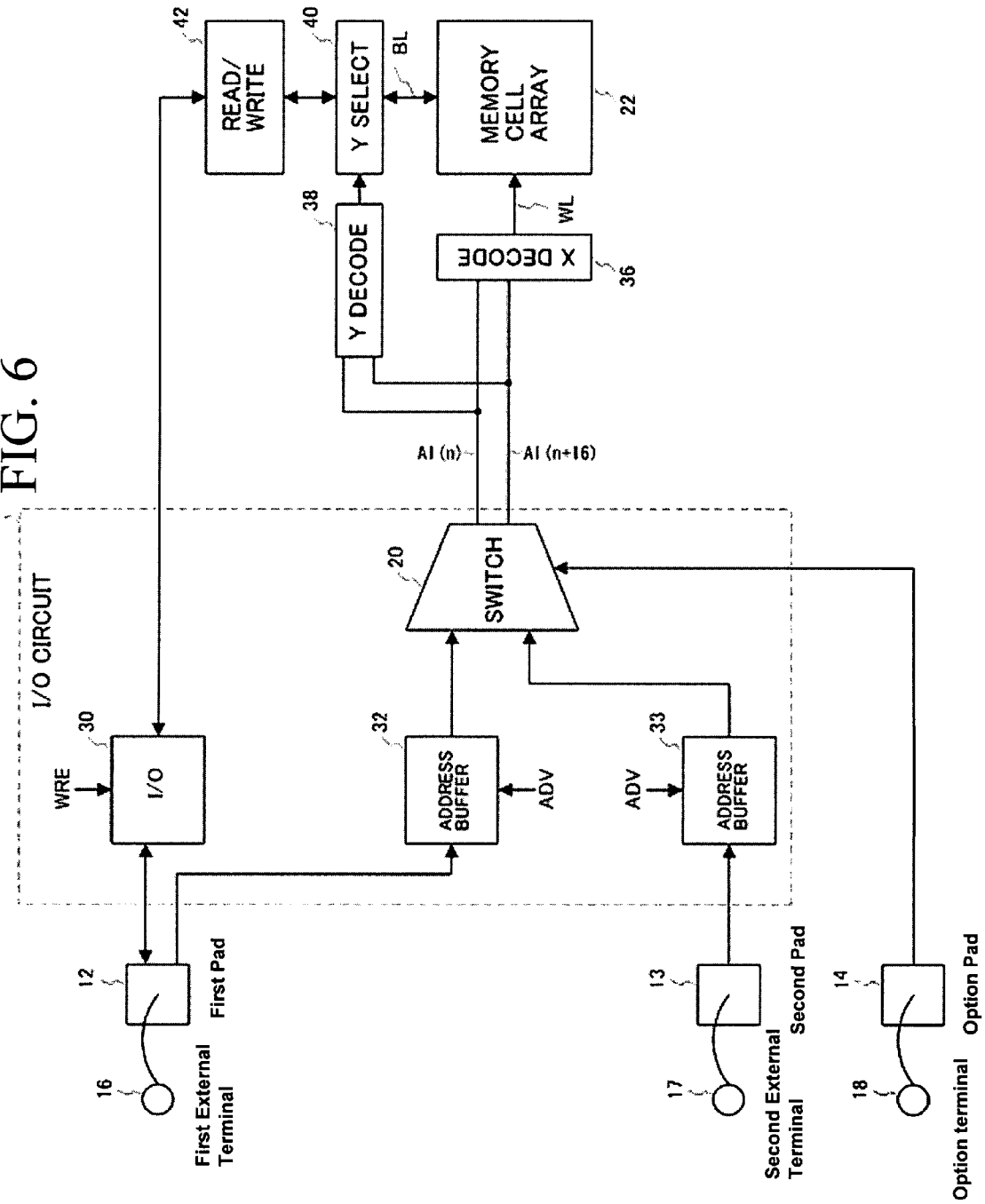
FIG. 6 is a block diagram of a semiconductor chip of the semiconductor memory device in accordance with the first embodiment.

FIG. 6 is a block diagram of the semiconductor chips 10a and 10b. First external terminals 16 are coupled to first pads 12, second external terminals 17 are coupled to second pads 13, and an option terminal 18 (Vss or Vcc) is coupled to the option pad 14. Each of the pads 12, 13 and 14 is coupled to an input/output circuit 24. The input/output circuit 24 includes an I/O circuit 30, address buffers 32 and 33, and a switch 20.

Although only one switch 20 is shown in FIG. 6, switches 20 are provided for the pair of the first pad 12 "D0/D16/A0A16" and the second pad 13 "A0/A16" through the pair of the first pad 12 "D15/D31/A15" and the second pad 13 "A15," and a switch signal from the option pad 14 is shared. For example, the pair of the first pad 12 "D0/D16/A0A/16" and the second pad 13 "A0/A16" are coupled to the internal address lines AI(0) and AI(16) via the corresponding switch 20. The address data that are input to the first pad 12 and the second pad 13 in accordance with the switch information are supplied to either the internal address line AI(O) or AI(16). Likewise, the pair of the first pad 12 "D8/D24/A8/A24" and the second pad 13 "A8/A24" are coupled to the internal address lines AI(8) and AI(24). The pairs of the first pads 12 "D9/D25/A9" through "D15/D31/A15" and the second pads 13 "A9" through "A15" are coupled to the internal address lines AI(9) through AI(15) via the respective switches 20. The address data that is input to either the first pads 12 or the second pads 13 in accordance with the switch information is supplied to the internal address lines AI(9) through AI(15).

Storage data or address data that is input to or output from one of the first pads 12 is input to or output from the I/O circuit 30 or is output to the address buffer 32. A WRE signal is input to the I/O circuit 30. The WRE signal is a signal to activate the I/O circuit 30. Where storage data is to be input or output, the I/O circuit 30 is activated. An ADV signal is input to the address buffer 32. The ADV signal is a signal to activate the address buffers 32 and 33. Where address data is to be input, the address buffers 32 and 33 are activated, and output the address data to the corresponding switch 20. Meanwhile, address data that is input to one of the second pads 13 is output to the address buffer 33. The address buffer 33 outputs the address data to the corresponding switch 20. The option pad 14 is coupled to the switches 20. Depending on whether the option pad is Vss or Vcc, each of the switches 20 switches or does not switch the address data that is input from the address buffers 32 and 33. The switch 20 then outputs the address data to the address lines AI(n) and AI(n+16).

The internal address lines AI output the addresses of storage data stored in the memory cell array 22 to an X-decoder 36 and a Y-decoder 38. The I/O circuit 30 inputs or outputs storage data to and from a write/read circuit 42. The write/read circuit 42 writes or reads the storage data into or from the memory cell array 22 via a Y-selector 40. The Y-selector 40 selects the bit line BL through which the storage data is written or read in accordance with an instruction from the Y-decoder 38. The X-decoder 36 selects the word line WL through which the storage data is written or read. In this manner, storage data can be written or read at a desired address in the memory cell array 22.

Referring now to FIG. 7 through FIG. 10, a control operation to be performed in the semiconductor memory device of the first embodiment when storage data is input to or output from the memory cell array 22 and address data is input to the memory cell array 22 is described.

FIG. 7 shows the data structure that is used where address data is input to the semiconductor chip 10a. The pads 12a and 13a of the semiconductor chip 10a (the chip 1 in FIG. 7) are coupled to the external terminals 16a and 17a, as shown in FIG. 5. The bits AB0 through AB24 of the 25 bits of address data as inputs from external terminals are input from the external terminals ExD0/A0 through ExD24/A24, respectively. As the semiconductor chip 10a has the external terminals ExD0/A0 through ExD15/A15 coupled respectively to the pads D0/D16/A0/A16 through D15/D31/D15, which are the first pads 12a, the bits AB0 through AB15 of the address data are input to the pads D0/D16/A0/A16 through D15/D31/D15, respectively. The bits AB0 through AB15 are then input to the address buffer 32 and the I/O circuit 30. While the address data is input, the address buffer 32 is activated by the AVD signal. The I/O circuit 30 is inactivated by the WRE signal. In this manner, the bits AB0 through AB15 are input to the address buffer 32, but are not input to the I/O circuit 30. The address buffer 32 outputs the bits AB0 through AB15 to the switch 20a.

Meanwhile, since the external terminals ExD16/A16 through ExD24/A24 are coupled respectively to the pads A0/A16 through A8/A24, which are the second pads 13a, the bits AB16 through AB24 of the address data are input to the pads A0/A16 through A8/A24, respectively. Since the address buffer 33 is activated like the address buffer 32, the bits AB16 through AB24 are input to the address buffer 33. The address buffer 33 outputs the bits AB16 through AB24 to the switch 20a.

The option pad 14a of the semiconductor chip 10a is coupled to Vss. Here, the switch 20a does not switch the address data input from the first pads 12a and the second pads 13a, and outputs the address data. More specifically, the address signal that is input through the first pads 12a is output to the first internal address lines AI(n), and the address signal that is input through the second pads 13a is output to the second internal address lines AI(n+16). The internal address lines AI in FIG. 7 are the respective internal address lines to which the bits that are input to the respective pads are output. As shown in FIG. 7, the switch 20a does not switch the bits AB0 through AB15 that are input to the pads D0/D16/A0/A16 through D15/D31/D15 of the first pads 12a, to and from the bits AB16 through AB24 that are input to the pads A0/A16 through A8/A24 of the second pads 13a. Instead, the switch 20a outputs those bits to the internal address lines AI as they are.

FIG. 8 shows the data structure that is used where storage data is input to or output from the semiconductor chip 10a. The bits DB0 through DB15 of storage data that are input to or output from the external terminals ExD0/A0 through ExD15/A15 are input to or output from the pads D0/D16/A0/A16 through D15/D31/A15, respectively. While the storage data is input or output, the I/O circuit 30 is activated, and the address buffer 32 is inactivated. Accordingly, the bits DB0 through DB 15 of the storage data are input to or output from the I/O circuit 30, but are not input to the address buffer 32. The bits DB16 through DB31 of the storage data that is input to or output from the external terminals ExD16/A16 through ExD31 as the external terminals 17a are input to or output from the pads A0/A16 through A15 as the second pads 13a, respectively. The second pads 13a are not coupled to the I/O circuit 30. While the storage data is input or output, the address buffer 33 is inactivated. Accordingly, the bits DB16 through DB31 of the storage data are not input to the I/O circuit 30.

As described above, in the semiconductor chip 10a, the bits DB0 through DB15 of the storage data are written or read at the addresses represented by the bits AB0 through AB24 of the address data.

FIG. 9 shows the data structure that is used where address data is input to the semiconductor chip 10b. The pads 12b and 13b of the semiconductor chip 10b (the chip 2 in FIG. 9) are coupled to the external terminals, as shown in FIG. 5. The bits AB0 through AB24 of the 25 bits of address data as inputs from external terminals are input from the external terminals ExD0/A0 through ExD24/A24, respectively. As the semiconductor chip 10b has the external terminals ExD16/A16 through ExD24/A24 coupled respectively to the pads D0/D16/A0/A16 through D8/D24/A8/A24, which are the first pads 12b, the bits AB16 through AB24 of the address data are input to the first pads D0/D16/A0/A16 through D8/D24/A8/A24, respectively. While the address data is input, the address buffer 32 is activated, and the I/O circuit 30 is inactivated. Accordingly, the bits AB16 through AB24 of the address data are input to the address buffer 32, but are not input to the I/O circuit 30. The address buffer 32 outputs the bits AB16 through AB24 to the switch 20b.

Meanwhile, since the external terminals ExD0/A0 through ExD15/A15 are coupled respectively to the pads A0/A16 through A15, which are the second pads 13b, the bits AB0 through AB15 of the address data are input to the second pads A0/A16 through A15, respectively. Since the address buffer 33 is activated like the address buffer 32, the bits AB0 through AB15 are input to the address buffer 33. The address buffer 33 outputs the bits AB0 through AB15 to the switch 20b.

The option pad 14b of the semiconductor chip 10b is coupled to Vcc. Here, the switch 20b switches the address data that are input from the first pads 12b and the second pads 13b, and then outputs the address data. More specifically, the address data that is input through the first pads 12b is output to the second internal address lines AI(n+16), and the address data that is input through the second pads 13b is output to the first internal address lines AI(n). The switch 20b switches the bits AB16 through AB24 that are input to the pads D0/D16/A0/A16 through D8/D24/A8/D24 of the first pads 12b, to and from the bits AB0 through AB31 that are input to the pads A0/A16 through A15/A31 of the seconds pads 13b. The switch 20a then outputs those bits to the internal address lines AI.

FIG. 10 shows the data structure that is used where storage data is input to or output from the semiconductor chip 10b. The bits DB16 through DB31 of storage data that are input to or output from the external terminals ExD16/A16 through ExD31 are input to or output from the pads D0/D16/A0/A16 through D15/D31/A15 of the first pads 12b, respectively. While the storage data is input or output, the I/O circuit 30 is activated, and the address buffer 32 is inactivated. Accordingly, the bits DB 16 through DB31 of the storage data are input to or output from the I/O circuit 30, but are not input to the address buffer 32. The bits DB0 through DB15 of the storage data that are input to or output from the external terminals ExD0/A0 through ExD15/A15 are input to or output from the pads A0/A16 through A15 as the second pads 13b, respectively. The second pads 13b are not coupled to the I/O circuit 30. While the storage data is input or output, the address buffer 33 is inactivated. Accordingly, the bits DB0 through DB15 of the storage data are not input to the I/O circuit 30.

As described above, in the semiconductor chip 10b, the bits DB16 through DB31 of the storage data are written or read at the addresses represented by the bits AB0 through AB24 of the address data.

The semiconductor chip 10a (or 10b) of the semiconductor memory device of the first embodiment includes pads 12a and 13a (or 12b and 13b) that are the terminals for inputting the address data indicating the addresses at which storage data is stored in the memory cell array 18. The first pads 12a (or 12b) are the pads (the first terminals) to which the bits AB0 through AB15 (or AB16 through AB24) of the address data are input, and the second pads 13a (or 13b) are the pads (the second terminals) to which the bits AB16 through AB24 (or AB0 through AB15) are input, which is the rest of the address data. The address data is supplied to the first internal address lines AI(n) (n being 0 through 15) and the second internal address lines AI(n+16) (n being 0 through 8). When the bits AB0 through AB24 of the address data are input to the pads 12a and 13a (or 12b and 13b), the switch 20a (or 20b) switches or does not switch the bits AB0 through AB15 of the address data to and from the bits AB16 through AB24 of the address data in accordance with the voltage of the option pad 14a (or the predetermined switch information). In other words, the switch 20a of the semiconductor chip 10a couples the bits AB0 through AB15 of the address data to the first internal address lines AI(n), and couples the bits AB16 through AB24 to the second internal address lines AI(n+16). The switch 20b of the semiconductor chip 10b couples the bits AB0 through AB15 of the address data to the second internal address lines AI(n+16), and couples the bits AB16 through AB24 to the first internal address lines AI(n). In this manner, in the semiconductor chips 10a and 10b, the switches 20a and 20b output the address data supplied from the outside to the internal address lines AI, after switching or not switching the bits AB0 through AB15 of the address data to and from the bits AB16 through AB24 in accordance with the voltages of the option pads 14a and 14b.

Also, as shown in FIG. 6, when the bits DB0 through DB15 (or the bits DB16 through DB31) of storage data are input to or output from the first pads 12a (or 12b), the storage data is input to or output from the memory cell array 18, without passing through the switch 20a. In this manner, the bits DB0 through DB15 (or the bits DB16 through DB31) of the storage data can be input to or output from the memory cell array 18, regardless of the switch information.

The first pads 12a (or 12b) (the first terminals) input or output the bits DB0 through DB15 (or the bits DB16 through DB31) of the storage data, and input the bits AB0 through AB15 (or the bits AB16 through AB24) of the address data. The second pads 13a (or 13b) input the bits AB16 through AB24 (or the bits AB0 through AB15) of the address data.

The switch information that is input to the option pads 14a and 14b (the switch information terminals) from external circuits is the voltages Vss and Vcc applied to the option pads 14a and 14b. In this manner, the voltages applied to the option pads 14a and 14b are set as the switch information, which can be easily input to the switches 20a and 20b.

The semiconductor memory device in accordance with the first embodiment includes the semiconductor chip 10a (the first semiconductor device) and the semiconductor chip 10*b* (the second semiconductor device). The external terminals ExD0/A0 through ExD15/A15 (the first external terminals) input or output the bits DB0 through DB15 (the first storage data) of the bits DB0 through DB31 of storage data, and output the bits AB0 through AB15 (the first address data) of the bits AB0 through AB24 of the address data. The external terminals ExD16/A16 through ExD31 (the second external terminals) input or output the bits DB16 through DB31 (the second storage data) of the bits DB0 through DB31 of the storage data, and output the bits AB16 through AB24 (the second address data) of the address data. The external terminals ExD0/A0 through ExD15/A15 (the first external terminals) are coupled to the pads D0/D16/A0/A16 through D15/D31/A15 (the first terminals), which are the first pads 12*a* of the semiconductor chip 10*a*. The external terminals ExD16/A16 through ExD31 (the second external terminals) are coupled to the second pads 13*a* (the second terminals) of the semiconductor chip 10*a*. At the same time, the external terminals ExD16/A16 through ExD31 (the second external terminals) are also coupled to the pads D0/D16/A0/A16 through D15/D31/A15 (the first terminals), which are the first pads 12*b* of the semiconductor chip 10*b*. The external terminals ExD0/A0 through ExD15/A15 (the first external terminals) are also coupled to the second pads 13*b* (the second terminals) of the semiconductor chip 10*b*. With this structure, each one of the external terminals ExD0/A0 through ExD31 is coupled to two pads, and is not coupled to three pads or one pad as in the case of the comparative example. In this manner, the loads on the external terminals can be made uniform.

The switch information in the semiconductor chip 10*a* indicates Vss, and the switch information in the semiconductor chip 10*b* indicates Vcc, which is different from the switch information in the semiconductor chip 10*a*. With this arrangement, one of the switches 20*a* and 20*b* of the semiconductor chips 10*a* and 10*b* switch the address data, but the other one does not switch the address data. In this manner, address data that is input to the different pads between the semiconductor chip 10*a* and the semiconductor 10*b* can be recovered to the address data with the original arrangement.

Furthermore, the size of the first storage data is 16 bits, and the size of the second storage data is 16 bits, which is the same as the size of the first storage data. Accordingly, the bits DB0 through DB31 of the storage data can be stored with the use of the semiconductor chips 10*a* and 10*b* with the same storage capacities and the same structures.

Figure 11:
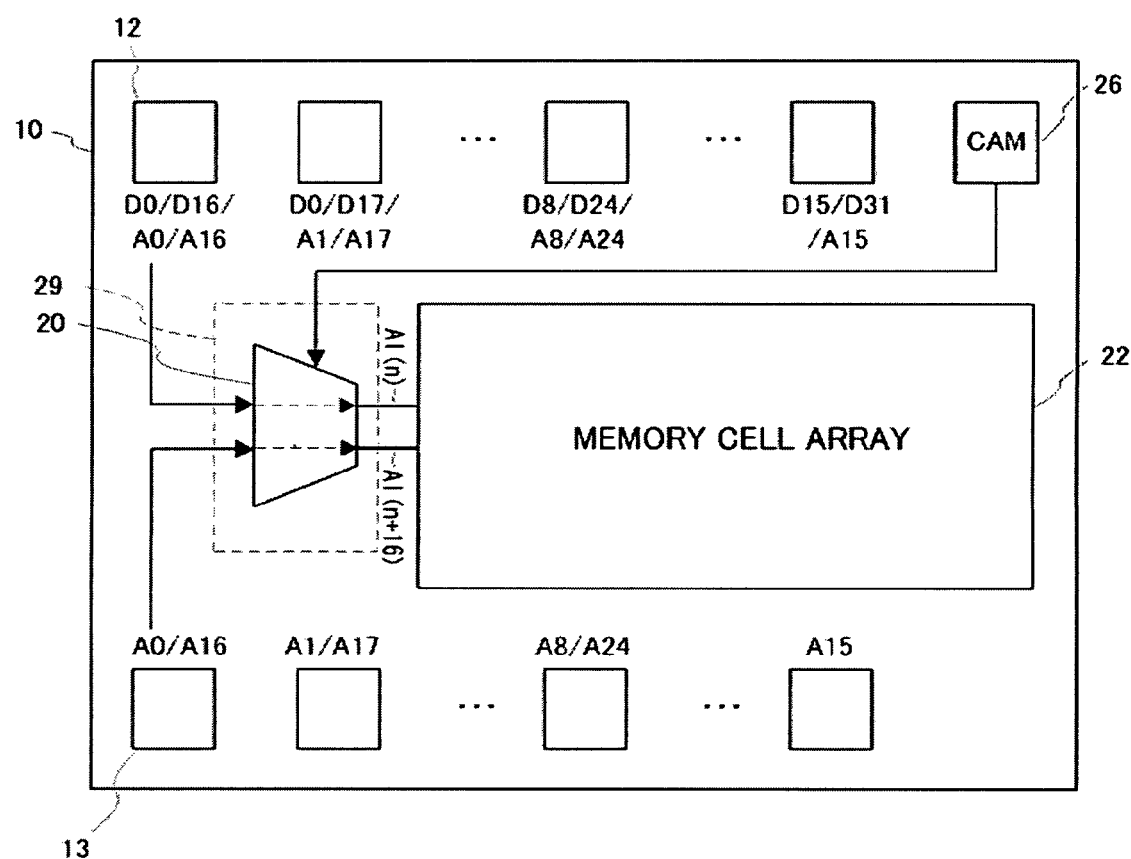
FIG. 11 is a schematic view of a semiconductor chip in accordance with a second embodiment of the present invention.

A second embodiment of the present invention is an example of a semiconductor chip that stores the switch information in a CAM (a content addressable memory), instead of an option pad. A semiconductor chip 10 shown in FIG. 11 differs from the semiconductor chip 10*a* of FIG. 4 in having a 1-bit CAM 26 in place of the option pad 14*a*. The other aspects of the structure of the semiconductor chip 10 of this embodiment are the same as those of the semiconductor chips 10*a* and 10*b* of the first embodiment, as the semiconductor chip 10 includes a memory cell array 22, a switch 20, and pads 12 and 13.

In accordance with the second embodiment, a CAM (the switch information storage unit) is provided to store the switch information. Two semiconductor chips 10 of the second embodiment are used to form a semiconductor memory device in accordance with the first embodiment. For example, at the time of shipment of semiconductor memory devices, data is input to each CAM, so as to complete semiconductor memory devices having the same functions as those of the first embodiment.

The first embodiment and the second embodiment are examples of semiconductor devices using flash memories. However, the present invention may be applied to semiconductor devices such as DRAMs and SRAMs having memory cell arrays. Also, in the above described embodiments, the pads 12*a* and 12*b* of the semiconductor chips 10*a* and 10*b* are the first terminals, and the pads 13*a* and 13*b* of the semiconductor chips 10*a* and 10*b* are the second terminals. However, the first terminals and the second terminals may be simple terminals that input and output storage data or address data to and from semiconductor chips. For example, the first terminals and the second terminals may be bumps formed on semiconductor chip. Although the first external terminals and the second externals terminals are the leads on packages, but may be coupled with bumps or the likes. Further, the semiconductor chips 10*a* and 10*b* may be stacked to form a semiconductor memory device. In the above embodiments, the data width of the storage data to be input to or output from external circuits is 32 bits, and the data width of each of the semiconductor chips 10*a* and 10*b* is 16 bits. However, the data widths are not limited to the above values. As in the first embodiment, the data width of the storage data to be input to or output from external circuits should preferably be twice the data width of each of the semiconductor chips 10*a* and 10*b*.

Figure 12:
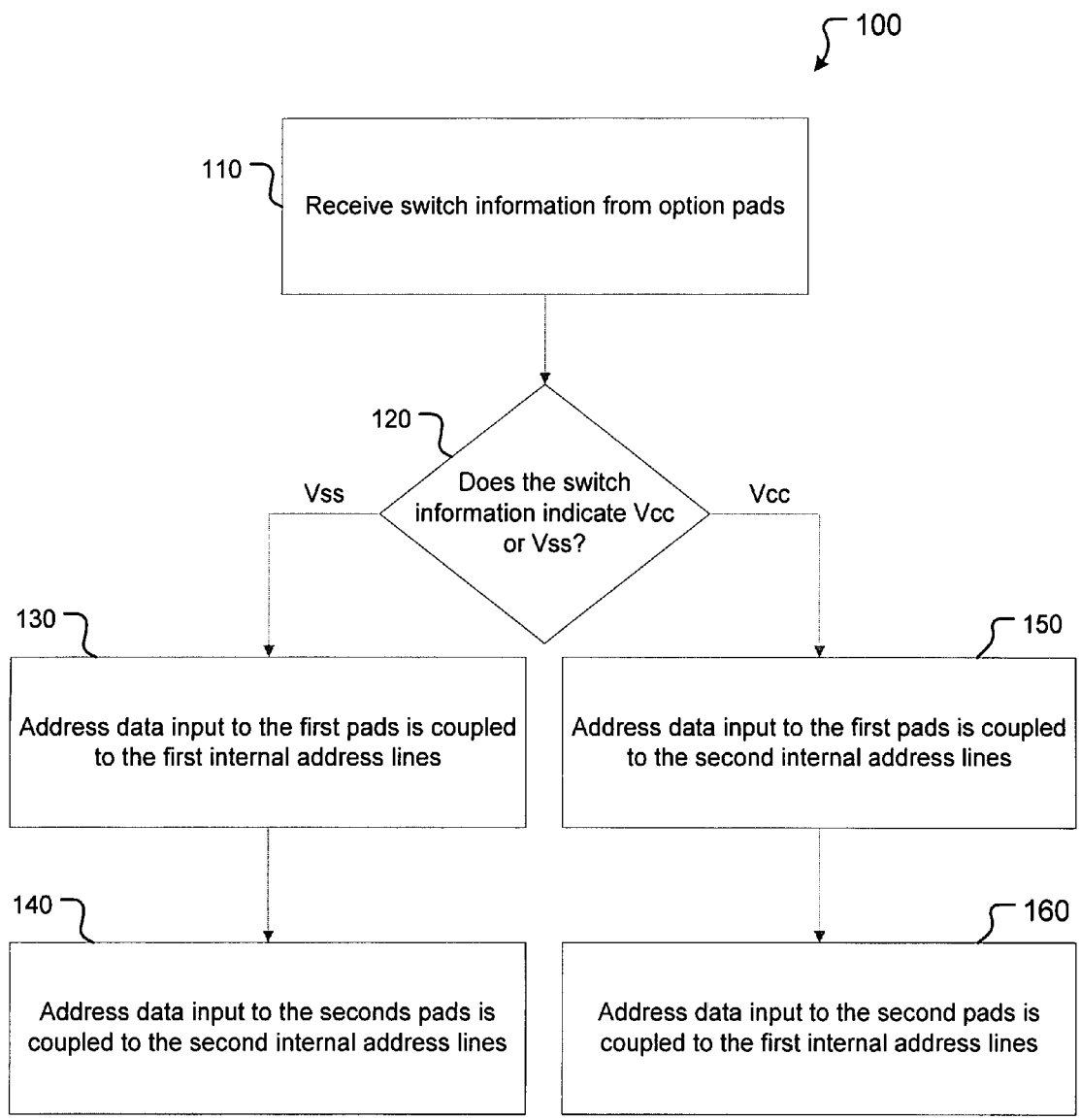
FIG. 12 illustrates a flowchart for a process of allocating address data in a semiconductor device in accordance with an embodiment of the present invention.

FIG. 12 illustrates a flowchart 100 for a process of allocating address data in a semiconductor device in accordance with an embodiment of the present invention. At block 110, a switch signal is received by the switch 20 from the option pads 14. At block 120, the switch 20 determines whether the option pad 14 is Vss or Vcc. If the option pad 14 is Vss, at block 130 address data input to the first pads 12 is coupled to the first internal address lines (AI(n)). The address data input to the second pads 13 is then coupled to the second internal address lines (A(n+16)) at block 140. If the option pad 14 is Vcc, at block 140 the address data input to the first pads 12 is coupled to the second internal address lines (A(n+16)). The address data input to the second pads 13 is then coupled to the first internal address lines (A(n)) at block 160.

Figure 13:
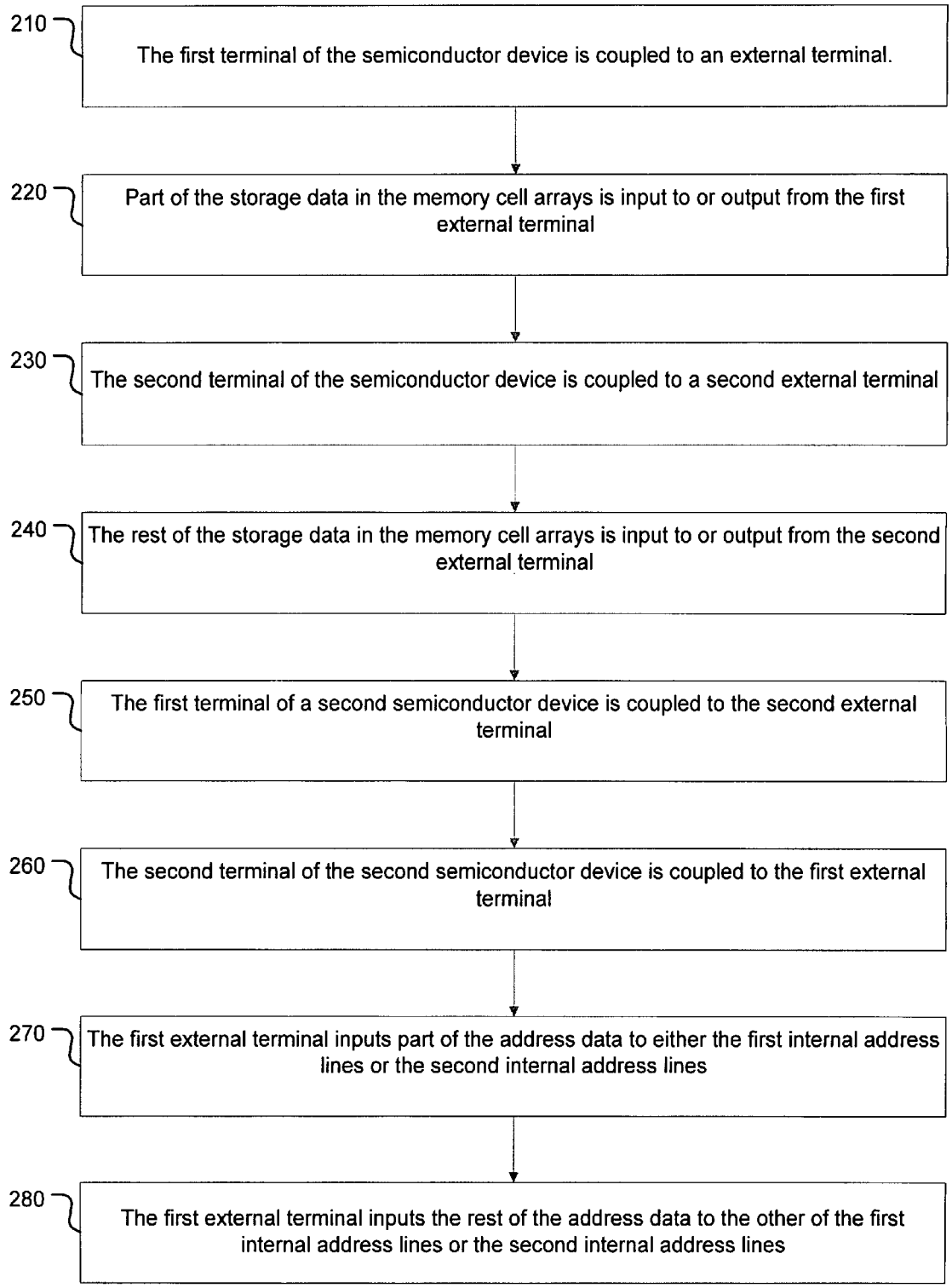
FIG. 13 illustrates a flowchart for a process of allocating address data and storage data in more than one semiconductor device in accordance with an embodiment of the present invention.

FIG. 13 illustrates a flowchart 200 for a process of allocating address data and storage data in more than one semiconductor device in accordance with an embodiment of the present invention. At block 210 the first terminal of the semiconductor device 10*a* is coupled to an external terminal 16. At block 220 part of the storage data in the memory cell arrays 22 is input to or output from the first external terminal 16. At block 230 the second terminal of the semiconductor device 10*a* is coupled to a second external terminal 17. At block 240 the rest of the storage data in the memory cell arrays 22 is input to or output from the second external terminal 17. At block 250 the first terminal of a second semiconductor device 10*b* is coupled to the second external terminal 17. At block 260 the second terminal of the second semiconductor device 10*b* is coupled to the first external terminal 16. At block 270 the first external terminal 16 inputs part of the address data to either the first internal address lines (AI(n)) or the second internal address lines (AI(n+16)). Then, at block 280, first external terminal 16 inputs the rest of the address data to the other of set of address lines (either AI(n) or AI(n+16)) that was not input to at block 270.

Embodiments generally relate to semiconductor devices. More particularly, embodiments allow for a semiconductor device with a shorter distance between the bit lines and higher storage capacity and density than those conventionally known. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells," each of which traditionally stores one bit of information. However, newer flash memory devices can store more than 1 bit per cell. These newer flash memory devices double the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, the newer flash memory devices have several key advantages, such as being capable of burst-mode access as fast as 80 MHz, page access times as fast as 25 ns, simultaneous read-write operation for combined code and data storage, and low standby power (e.g., 1 µA).

Figure 14:
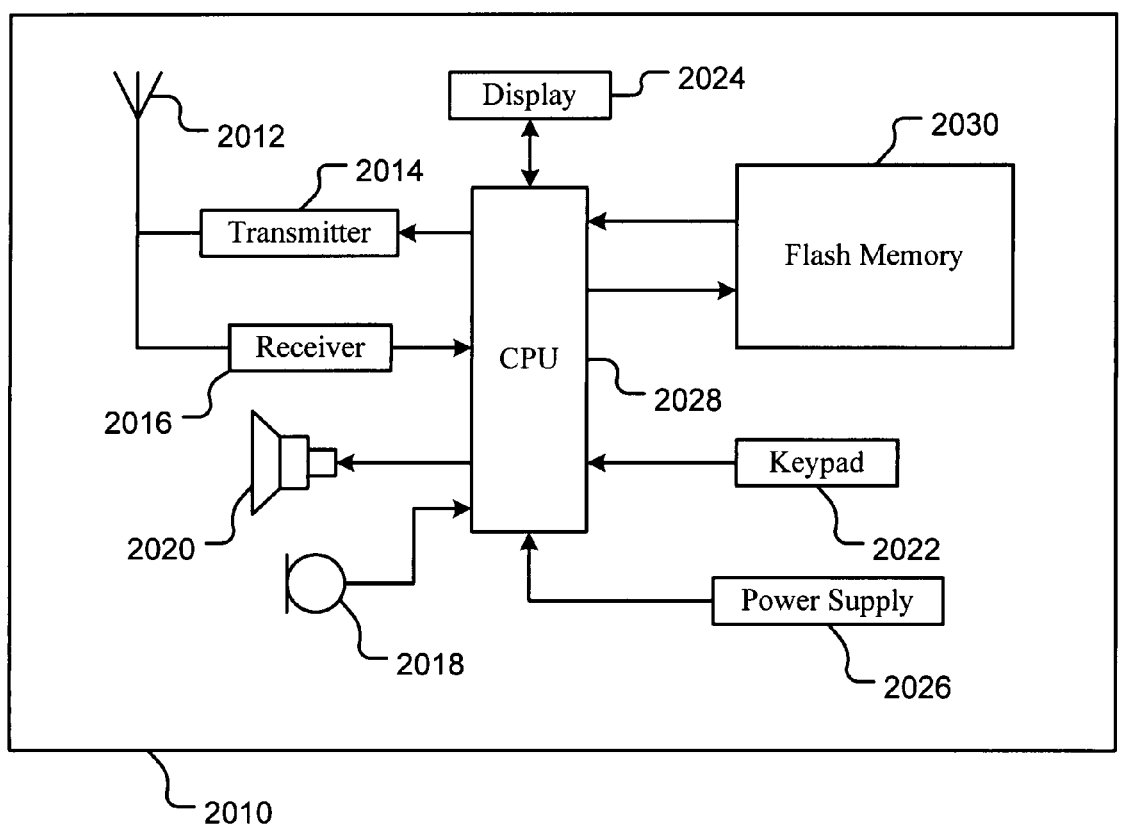
FIG. 14 illustrates a block diagram of an exemplary portable phone, upon which various embodiments of the invention may be implemented.

FIG. 14 shows a block diagram of an exemplary portable telephone 2010 (e.g., cell phone, cellular phone, mobile phone, internet protocol phone, wireless phone, etc.), upon which various embodiments of the invention can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory can include a semiconductor device comprising: a memory cell array; a terminal that inputs or outputs storage data stored in the memory cell array, and inputs address data indicating an address in the memory cell array at which the storage data is input or output, the terminal including a first terminal that inputs part of the address data and a second terminal that inputs the rest of the address data; a first internal address line and a second internal address line to which the address data is supplied; and a switch that couples the part of the address data to one of the first internal address line or the second internal address line in accordance with predetermined switch information, while coupling the rest of the address data to the other one of the first internal address line or the second internal address line, when the address data is input to the terminal.

In various embodiments, the flash memory 2030 can be utilized with various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are coupled to the bit lines in a parallel configuration, while in a conventional NAND-type flash memory, the memory cell transistors are coupled to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, an improved flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

It is noted that the components (e.g., 2012, 2014, 2016, 2022, 2028, 2030, etc.) of portable telephone 2010 can be coupled to each other in a wide variety of ways. For example, in an embodiment, the antenna 2012 can be coupled to transmitter 2014 and receiver 2016. Additionally, the transmitter 2014, receiver 2016, speaker 2020, microphone 2018, power supply 2026, keypad 2022, flash memory 2030 and display 2024 can each be coupled to the processor (CPU) 2028. It is pointed out that in various embodiments, the components of portable telephone 2010 can be coupled to each other via, but are not limited to, one or more communication buses, one or more data buses, one or more wireless communication technologies, one or more wired communication technologies, or any combination thereof.

Figure 15:
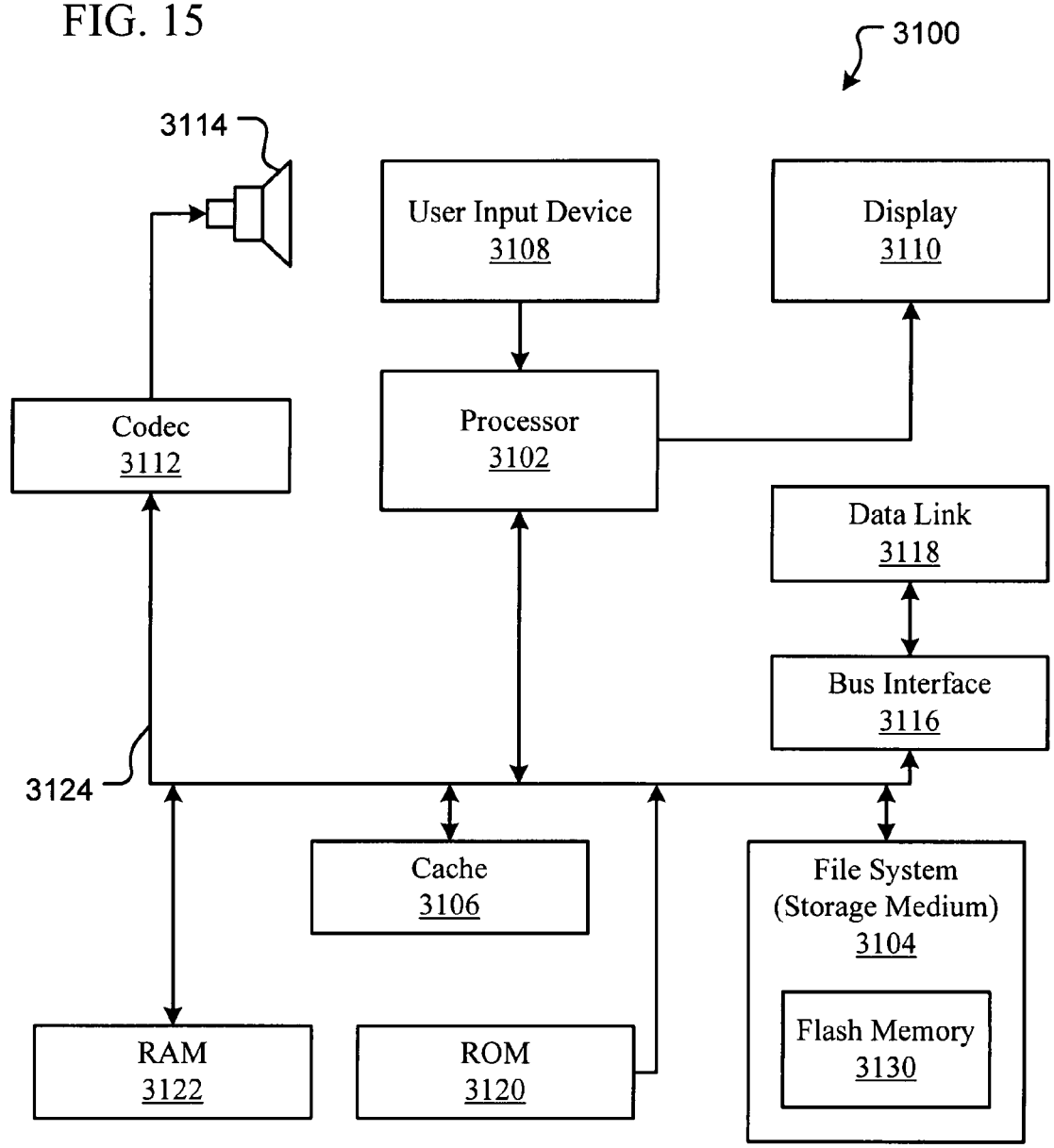
FIG. 15 illustrates a block diagram of an exemplary computing device, upon which various embodiments of the invention may be implemented.

FIG. 15 illustrates a block diagram of an exemplary computing device 2100, upon which various embodiments of the invention can be implemented. Although computing device 2100 is shown and described in FIG. 15 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. In an embodiment, computing device 2100 can include additional components not shown in FIG. 15.

Also, it is appreciated that the computing device 2100 can be, a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

Computing device 2100 can include at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 15 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could be a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 15 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, Flash memory 2120 can include a semiconductor device comprising: a memory cell array; a terminal that inputs or outputs storage data stored in the memory cell array, and inputs address data indicating an address in the memory cell array at which the storage data is input or output, the terminal including a first terminal that inputs part of the address data and a second terminal that inputs the rest of the address data; a first internal address line and a second internal address line to which the address data is supplied; and a switch that couples the part of the address data to one of the first internal address line or the second internal address line in accordance with predetermined switch information, while coupling the rest of the address data to the other one of the first internal address line or the second internal address line, when the address data is input to the terminal.

In various embodiments, the flash memory 2120 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes newer flash memory technology to allow storing of two physically distinct bits on opposite sides of a memory cell.

Device 2100 may also contain communications connection(s) or coupling(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection or coupling, and wireless media such as acoustic, radio frequency (RF), infrared and other wireless media. The term computer readable media as used herein includes both storage media and communication media.

It is noted that the components (e.g., 2102, 2104, 2110, 2120, etc.) of computing device 2100 can be coupled to each other in a wide variety of ways. For example in various embodiments, the components of computing device 2100 can be coupled to each other via, but are not limited to, one or more communication buses, one or more data buses, one or more wireless communication technologies, one or more wired communication technologies, or any combination thereof.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous.

Figure 16:
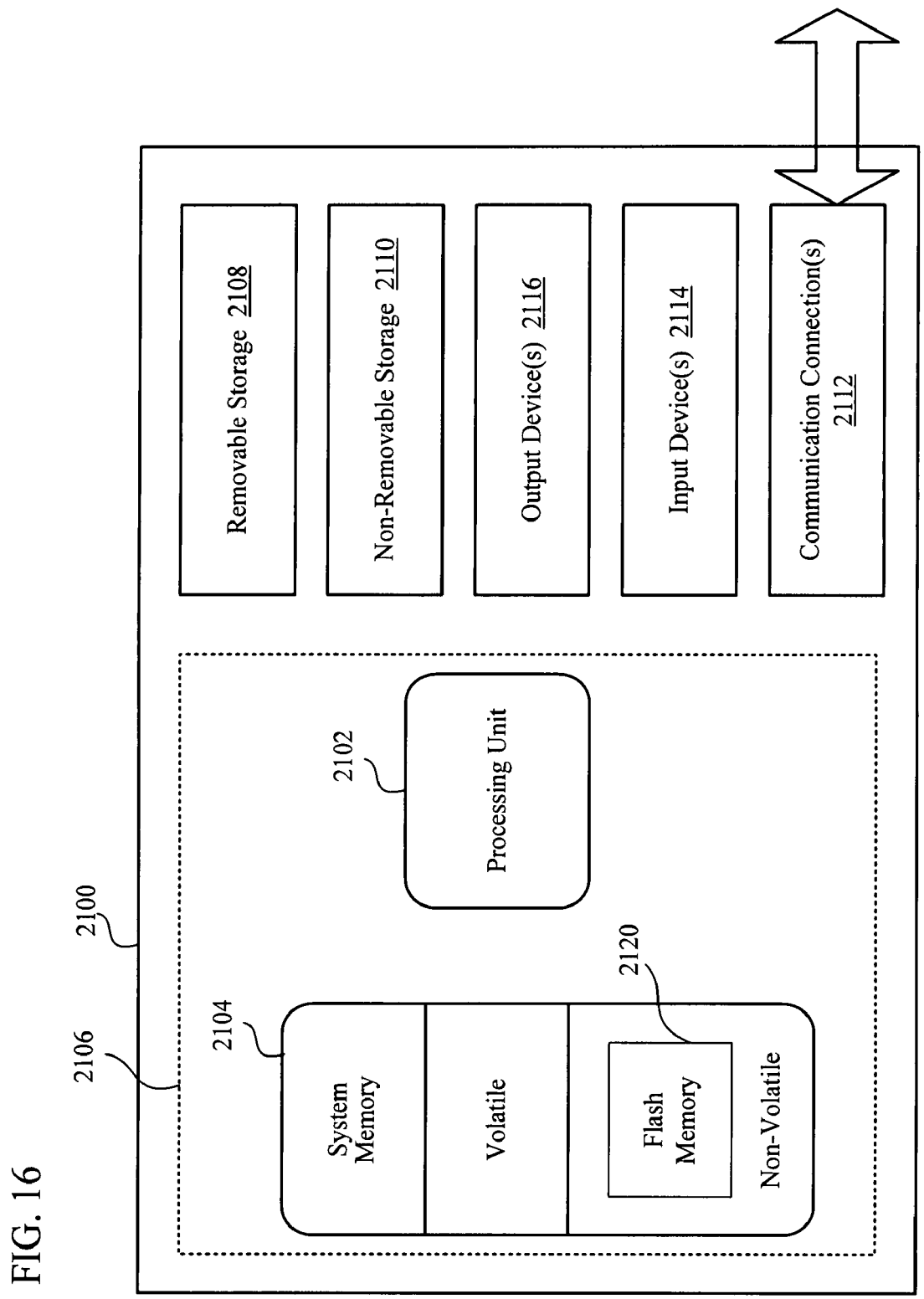
FIG. 16 illustrates an exemplary portable multimedia device, or media player, in accordance with various embodiments of the invention.

FIG. 16 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, Flash memory 3130 can include a semiconductor device comprising: a memory cell array; a terminal that inputs or outputs storage data stored in the memory cell array, and inputs address data indicating an address in the memory cell array at which the storage data is input or output, the terminal including a first terminal that inputs part of the address data and a second terminal that inputs the rest of the address data; a first internal address line and a second internal address line to which the address data is supplied; and a switch that couples the part of the address data to one of the first internal address line or the second internal address line in accordance with predetermined switch information, while coupling the rest of the address data to the other one of the first internal address line or the second internal address line, when the address data is input to the terminal.

In various embodiments, the flash memory 3130 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that couple to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

It is noted that the components (e.g., 3102, 3104, 3120, 3130, etc.) of media player 3100 can be coupled to each other in a wide variety of ways. For example, in an embodiment, the codec 3122, RAM 3122, ROM 3120, cache 3106, processor 3102, storage medium 3104, and bus interface 3116 can be coupled to data bus 3124. Furthermore, the data link 3118 can be coupled to the bus interface 3116. The user input device 3108 and the display 3110 can be coupled to the processor 3102 while the speaker 3114 can be coupled to the codec 3112. It is pointed out that in various embodiments, the components of media player 3100 can be coupled to each other via, but are not limited to, one or more communication buses, one or more data buses, one or more wireless communication technologies, one or more wired communication technologies, or any combination thereof.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the claims and their equivalents.

We claim:

1. A semiconductor device comprising:
  a memory cell array;
  a terminal that inputs or outputs storage data stored in the memory cell array, and inputs address data indicating an address in the memory cell array at which the storage data is input or output, the terminal comprising:
    a first terminal that inputs a first part of the address data; and
    a second terminal that inputs a second part of the address data,
    wherein the second part of the address data is comprised of the entire remaining portion of the address data not comprising the first part of the address data;
  a first internal address line and a second internal address line to which the address data is supplied; and
  a switch that couples the first part of the address data to one of the first internal address line or the second internal address line in accordance with predetermined switch information, while coupling the second part of the address data to the other one of the first internal address line or the second internal address line, when the address data is input to the terminal.

2. The semiconductor device as claimed in claim 1, wherein the storage data is input to or output from the memory cell array, without passing through the switch, when the storage data is input to or output from the terminal.

3. The semiconductor device as claimed in claim 1,
  wherein the first terminal inputs or outputs the storage data, and inputs the first part of the address data; and
  wherein the second terminal inputs the second part of the address data.

4. The semiconductor device as claimed in claim 1, further comprising a switch information terminal that inputs the predetermined switch information, wherein the predetermined switch information is a voltage applied to the switch information terminal.

5. The semiconductor device as claimed in claim 1, further comprising a switch information storage unit that stores the predetermined switch information.

6. A system comprising a semiconductor device, the semiconductor device comprising:
a memory cell array;
a terminal that inputs or outputs storage data stored in the memory cell array, and inputs address data indicating an address in the memory cell array at which the storage data is input or output, the terminal comprising:
a first terminal that inputs a first part of the address data; and
a second terminal that inputs a second part of the address data,
wherein the second part of the address data is comprised of the entire remaining portion of the address data not comprising the first part of the address data;
a first internal address line and a second internal address line to which the address data is supplied; and
a switch that couples the first part of the address data to one of the first internal address line or the second internal address line in accordance with predetermined switch information, while coupling the second part of the address data to the other one of the first internal address line or the second internal address line, when the address data is input to the terminal.

7. The system of claim 6, wherein the semiconductor device is a first semiconductor device, the system further comprising a second semiconductor device, comprising:
a memory cell array;
a terminal that inputs or outputs storage data stored in the memory cell array, and inputs address data indicating an address in the memory cell array at which the storage data is input or output, the terminal comprising:
a first terminal that inputs a first part of the address data; and
a second terminal that inputs a second part of the address data,
wherein the second part of the address data is comprised of the entire remaining portion of the address data not comprising the first part of the address data;
a first internal address line and a second internal address line to which the address data is supplied; and
a switch that couples the first part of the address data to one of the first internal address line or the second internal address line in accordance with predetermined switch information, while coupling the second part of the address data to the other one of the first internal address line or the second internal address line, when the address data is input to the terminal;
wherein:
the first terminal of the first semiconductor device is coupled to a first external terminal;
the first external terminal inputs or outputs a first storage data that is part of the storage data stored in the memory cell arrays of the first semiconductor device and the second semiconductor device;
the first external terminal also inputs the first address data;
the second terminal of the first semiconductor device is coupled to a second external terminal;
the second external terminal inputs or outputs a second storage data that comprises the remaining portion of the storage data not comprising the first storage data;
the second external terminal also inputs the second address data;
the first terminal of the second semiconductor device is coupled to the second external terminal; and
the second terminal of the second semiconductor device is coupled to the first external terminal.

8. The system as claimed in claim 7, wherein the predetermined switch information in the first semiconductor device is different from the predetermined switch information in the second semiconductor device.

9. The system as claimed in claim 7, wherein the first storage data has the same size as the second storage data.

10. The system as claimed in claim 6, wherein the semiconductor device is a flash memory, the system further comprising:
a processor;
a cache; and
a user input component.

11. The system as claimed in claim 10, wherein said system is a wireless communications device further comprising:
a communications component;
a transmitter;
a receiver; and
an antenna coupled to the transmitter circuit and the receiver circuit.

12. The system as claimed in claim 10, wherein said system is a computing device further comprising an output component.

13. The computing device as claimed in claim 12, wherein said computing device is a personal computer (PC).

14. The computing device as claimed in claim 12, wherein said computing device is a personal digital assistant (PDA).

15. The computing device as claimed in claim 12, wherein said computing device is a gaming system.

16. The system as claimed in claim 10, wherein said system is a portable media player further comprising a coder-decoder component.

17. The portable media player as claimed in claim 16, wherein said portable media player is a portable music player.

18. The portable media player as claimed in claim 16, wherein said portable media player is a portable video player.

19. A method of controlling a system that includes a semiconductor device comprising: a memory cell array; a terminal that inputs or outputs storage data stored in the memory cell array, and inputs address data indicating an address in the memory cell array at which the storage data is input or output, the terminal comprising: a first terminal that inputs a first part of the address data; and a second terminal that inputs a second part of the address data, wherein the second part of the address data is comprised of the entire remaining portion of the address data not comprising the first part of the address data; a first internal address line and a second internal address line to which the address data is supplied;
the method comprising:
coupling the first part of the address data to either the first internal address line or the second internal address line, while coupling the second part of the address data to the other of the first internal address line or the second internal address line, based on predetermined switch information, when the address data is input to the terminal.

20. The method of controlling a system as claimed in claim 19, wherein the system further comprises a second semiconductor device, the second semiconductor comprising: a memory cell array; a terminal that inputs or outputs storage data stored in the memory cell array, and inputs address data indicating an address in the memory cell array at which the storage data is input or output, the terminal comprising: a first terminal that inputs a first part of the address data; and a second terminal that inputs a second part of the address data, wherein the second part of the address data is comprised of the entire remaining portion of the address data not comprising the first part of the address data; a first internal address line and a second internal address line to which the address data is supplied;

the method further comprising:

coupling the first terminal of the first semiconductor device to a first external terminal that inputs or outputs a first storage data that is part of the storage data stored in the memory cell arrays of the first semiconductor device and the second semiconductor device, wherein the first external terminal also inputs the first address data;

coupling the second terminal of the first semiconductor device to a second external terminal, wherein the second external terminal inputs or outputs a second storage data that is the remaining portion of the storage data not comprising the first storage data, and also inputs the second address data;

coupling the first terminal of the second semiconductor device to the second external terminal;

coupling the second terminal of the second semiconductor device to the first external terminal; and coupling the first part of the address data to either the first internal address line or the second internal address line, while coupling the second part of the address data to the other of the first internal address line or the second internal address line, based on predetermined switch information when the address data is input to the terminal of each of the first semiconductor device and the second semiconductor device.

* * * * *